United States Patent [19]

Fujita et al.

[11] Patent Number: 4,457,950

[45] Date of Patent: Jul. 3, 1984

[54] PROCESS FOR PRODUCING WIRING CIRCUIT BOARD

[75] Inventors: Tsuyoshi Fujita, Yokohama; Shinichi Komatsu, Fujisawa; Gyazo Toda, Hino, all of Japan

[73] Assignee: Hitachi, Ltd., Tokyo, Japan

[21] Appl. No.: 497,578

[22] Filed: May 24, 1983

[30] Foreign Application Priority Data

May 28, 1982 [JP] Japan ................................. 57-89861

[51] Int. Cl.$^3$ ............................................. B05D 3/06
[52] U.S. Cl. ................................ 427/43.1; 204/192 D; 427/99; 427/124; 427/126.4; 427/256; 427/265

[58] Field of Search ................ 204/192 D; 427/43.1, 427/99, 124, 126.4, 256, 265

Primary Examiner—Bernard D. Pianalto
Attorney, Agent, or Firm—Antonelli, Terry & Wands

[57] ABSTRACT

A wiring circuit board with a fine wiring pattern free from disconnection and poor insulation is produced by forming an insulating layer consisting of at least two insulating substances having different dissociation energies for metalization, including metal elements, on a substrate and irradiating the insulating layer with an energizing beam by scanning, thereby forming a wiring pattern as desired.

10 Claims, 11 Drawing Figures

PROCESS FOR PRODUCING WIRING CIRCUIT BOARD

BACKGROUND OF THE INVENTION

This invention relates to a process for producing a wiring circuit board having a fine wiring pattern on a substrate.

BRIEF DESCRIPTION OF THE PRIOR ART

Heretofore, a wiring circuit board of thin film, multi-layer structure has been produced by forming a metal layer on a substrate by vacuum vapor deposition, sputtering, etc., removing unwanted parts from the metal layer by etching, thereby obtaining a desired wiring pattern, forming an insulating layer of metal oxide or metal nitride on the metal layer by sputtering, chemical vapor deposition, etc., removing predetermined parts from the insulating layer by chemical etching, thereby forming via-holes (through-holes), and then forming another wiring pattern on the insulating layer in the same manner as above. However, the wiring circuit board of thin film multi-layer structure tends to have less smooth surface with increasing number of layers owing to be formation of wiring pattern by etching. When a metal layer or an insulating layer is formed on such less smooth surface by sputtering or vapor deposition, only a smaller amount of metallic substance or insulating substance is deposited on the less smooth surface, with the result of uneven layer thickness and occurrence of disconnection or poor insulation. This leads to poor reliability and low production yield.

Furthermore, formation of a metal layer in via-holes is not satisfactory, so that the connection of wiring patterns in the individual layers is incomplete. This is a cause of disconnection. The number of layers that ensures is now limited to 2 at most.

SUMMARY OF THE INVENTION

An object of the present invention is to provide a process for producing a wiring circuit board free from occurrence of disconnection and poor insulation.

According to the present invention, an insulating layer comprising a plurality of insulating substances having different dissociation energies for metalization, including metal elements is provided on a substrate, and an energying beam is given to a predetermined position on the insulating layer, thereby metalizing one of the insulating substances to form a wiring pattern.

BRIEF DESCRIPTION OF THE DRAWINGS

FIG. 2—2 to FIG. 2—7 show steps for producing wiring circuit board of thin film multi-layer structure according to another embodiment of the present invention.

PREFERRED EMBODIMENT OF THE INVENTION

EXAMPLE 1

A substrate 6 with a smooth surface made of sapphire or 99.5% $Al_2O_3$ was heated at 400°–700° C. (FIG. 1—1), while Si and Cu were heated by a heater and vaporized to form a metal layer 7 consisting of a plurality of different metals, i.e. Si and Cu, on the substrate (FIG. 1—2).

Figure 1:
FIG. 1—1 to FIG. 1—4 show steps for producing a wiring circuit board of thin film multi-layer structure according to one embodiment of the present invention.
Figures 1, 2:
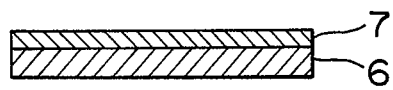
Figures 1, 2, 3:
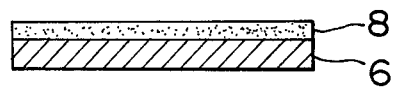
Figures 1, 2, 3, 4:
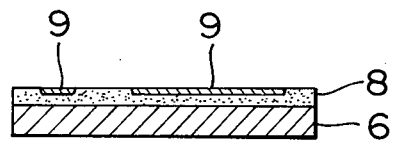
Figures 1, 2:
Figure 2:
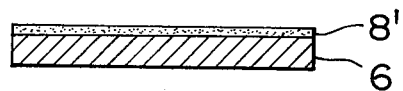
Figures 2, 3:
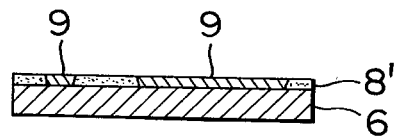
Figures 2, 3, 4:
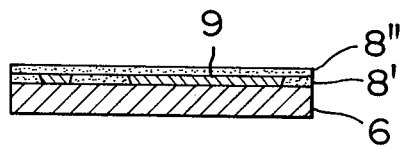
Figures 2, 3, 4, 5:
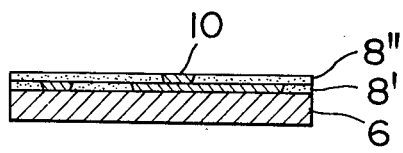
Figures 2, 3, 4, 5, 6:
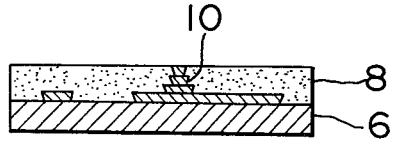
Figures 2, 3, 4, 5, 6, 7:
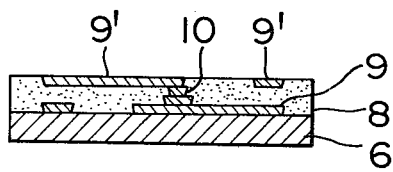

Then, the metal layer 7 was heated in an $O_2$ gas at 1,000° C. to form an insulating layer 8 consisting of metal oxides, i.e. $SiO_2$ and $Cu_2O$ (FIG. 1—3). $Cu_2O$ had a lower dissociation energy for oxygen than $SiO_2$. Then, the insulating layer 8 on the substrate 6 was irradiated at predetermined positions in a hydrogen gas atmosphere with a YAG laser beam having an energy density of 0.1 $J/cm^2$–1.5 $J/cm^2$ at a scanning speed of 1–20 cm/sec to deposit Cu, whereby a wiring pattern 9 was formed (FIG. 1—4).

The wiring pattern extended to a depth of 0.5–2 μm and had a good electroconductivity such as $10^{-4}$–$10^{-5}$ Ω.cm, whereas the non-irradiated parts had a good electric insulation such as $10^{10}$–$10^{13}$ Ω.cm.

The given energy is not limited to a laser beam, and any means of locally giving an energy to the insulating layer 8 can be used.

The metal layer 7 consisting of Si and Cu can react with a gas mixture of $N_2$ and $O_2$ at a specific mixing ratio. In this case, insulating substances Si-N-O and Cu-O are formed, and Cu-O has a lower dissociation energy for oxygen than Si-N-O, and Cu is deposited by giving an energy to the metal layer, whereby a wiring pattern based on the deposited Cu can be obtained. Or, an insulating layer 8 consisting of insulating substances $SiO_2$ and $Cu_2O$, or Si-N-O and Cu-O can be directly formed on the substrate 6 and Cu can be also deposited to obtain the desired wiring pattern.

EXAMPLE 2

Reference numerals used in this example refer to those shown in FIG. 1—1-FIG. 1—4 as in Example 1.

A substrate 6 made of sapphire was placed in a vacuum vapor deposition vessel having a plurality of vapor deposition source cells, and heated to 400°–600° C., while Si was heated by electron beams to vaporize, and Cu was heated by a heater to vaporize, and Si and Cu were vapor deposited on the substrate 6 to form a metal layer 7 consisting of Si and Cu having a layer thickness of 10 μm. Then, the substrate 6 was heated in an $O_2$ atmosphere at 1,000° C. to oxidize the metal layer 7 into insulating substances $SiO_2$ and $Cu_2O$, thereby forming an insulating layer 8. Then, the substrate 6 with the insulating layer 8 was placed in a vessel filled with $H_2$, and irradiated with a YAG laser beam having an energy density of 0.1 $J/cm^2$–1.5 $J/cm^2$ at a scanning speed of 1–20 cm/sec. along the desired pattern on the surface of the insulating layer 8. The parts irradiated with the laser beam extended to a depth of 0.5–2 μm and had a good electroconductivity such as $10^{-4}$–$10^{-5}$ Ω.cm, while the non-irradiated parts had a good electrical insulation such as $10^{10}$–$10^{13}$ Ω.cm. That is, a good wiring pattern 9 was obtained. This was because $Cu_2O$ having a lower dissociation energy for oxygen was selectively reduced to deposit Cu. Irregularity of the surface of the insulating layer 8 including the wiring pattern 9 was less than 0.1 μm, and thus the surface had a very good smoothness.

EXAMPLE 3

Reference numerals used in this example refer to those shown in FIG. 1—1-FIG. 1—4 as in Example 1.

In the same manner as in Example 2, a metal layer 7 consisting of Si and Cu and having a layer thickness of 10 μm was formed on a substrate 6 made of sapphire. Then, the metal layer was heated in a gas mixture of $N_2$ and $O_2$ having an $O_2$ concentration of 10–50% at 1,000° C. to change the metal layer into an insulating layer 8 consisting of insulating substances Si-N-O and Cu-O. Then, in the same manner as in Example 2, the insulating layer was irradiated with the laser beam by local scanning to change Cu-O into Cu through metalizing, whereby the desired wiring pattern 9 was obtained. The wiring pattern extended to a depth of 0.5–2 μm, and had a good electroconductivity such as $10^{-4}$–$10^{-5}$ Ω.cm, while the parts non-irradiated with the laser beam had a good electric insulation such as $10^{11}$–$10^{14}$ Ω.cm. The thus prepared wiring circuit board had a surface irregularity of less than 0.1 μm, and thus had a very good surface smoothness.

EXAMPLE 4

Reference numerals used in this example refer to those shown in FIG. 1—1-FIG. 1—4 as in Example 1.

A substrate 6 made of sapphire or 99.5% $Al_2O_3$ was heated and kept at 500°–800° C., while $SiO_2$ was heated by electron beams to vaporize and deposited onto the surface of the substrate 6 together with $Cu_2O$ by chemical vapor deposition at the same time, whereby an insulating layer 8 consisting of $SiO_2$ and $Cu_2O$ was directly formed onto the substrate. The chemical vapor deposition of $Cu_2O$ was carried out by heating Cu by a heater to vaporize, while irradiating the surface of substrate 6 with $O^+$ ion beams, thereby forming $Cu_2O$ on the substrate 6. Then, the insulating layer was irradiated with the laser beam in the same manner as in Example 2, whereby a wiring circuit pattern having a good result as in Example 2 was obtained.

EXAMPLE 5

A substrate 6 with a smooth surface, made of sapphire or 99.5% $Al_2O_3$ was heated at 400°–700° C. (FIG. 2—1), while Si and Cu were heated by a heater to vaporize, and $O_2$ was introduced toward the substrate 6 through a nozzle. A shower of electrons was allowed to hit Si, Cu and $O_2$ to partially ionize them, and an insulating layer 8' consisting of $SiO_2$ and $Cu_2O$ was formed on the substrate 6 by ion plating (FIG. 2—2).

A gas mixture of $O_2$ and $N_2$ can be used in place of $O_2$, where an insulating layer 8' consisting of Si-N-O and Cu-O can be obtained. In any case, the insulating layer 8 had a volume resistivity of $10^{10}$–$10^{14}$ Ω.cm.

In the same manner as in Example 2, a wiring pattern 9 was formed by laser beam irradiation (FIG. 2—3). The irradiated parts had an electroconductivity of $10^{-4}$–$10^{-5}$ Ω.cm, and had a surface irregularity of less than 0.1 μm, that is, a very good surface smoothness.

Then, another insulating layer 8" was formed on the insulating layer 8' and the wiring pattern 9 in the same manner as above (FIG. 2—4), and parts corresponding to via-holes were irradiated with a laser beam to form a connecting part 10 through the insulating layer 8" (FIG. 2—5).

Formation of further insulating layers and connecting parts were repeated to the desired thickness, as required (FIG. 2—6).

By laser beam irradiation of the surface of insulating layer 8 by scanning, the desired wiring patterns 9 and 9' were connected to each other through the connecting part 10 to obtain a wiring circuit board of two-wiring layer structure (FIG. 2—7).

To increase the number of layers, steps of FIG. 2—4 to FIG. 2—7 must be repeated, where the uppermost layer can always have a smooth surface and the thickness of wiring patterns can be kept even. Furthermore, the thickness of an insulating layer between any two layers of wiring patterns can be kept even. By repeating the steps of FIG. 2—4 and FIG. 2—5, an insulating layer can have a satisfactory thickness for the desired electric insulation. It is necessary to repeat the steps of FIG. 2—4 and FIG. 2—5, because, when too thick an insulating layer 8" is formed in the step of FIG. 2—4, it will take much time in forming the connecting part 10 through the insulating layer 8" and also because it is difficult to form a wiring pattern with a good precision due to the dissipation of heat within the insulating layer 8" during the formation of the connecting part. Thus, this insulating layers 8" must be formed one after another, while forming a connecting part 10 at a position corresponding to the via-hole in each insulating layer, so that a wiring pattern can be formed with good precision.

EXAMPLE 6

Reference numerals used in this example refer to those shown in FIG. 2—1-FIG. 2—7 as in Example 5.

A substrate 6 made of 99.5% $Al_2O_3$ was placed in an Ar atmosphere containing 10% $O_2$, and an insulating layer consisting of $Al_2O_3$, $SiO_2$ and $Cu_2O$ and having a layer thickness of 2 μm was formed on the surface of $Al_2O_3$ substrate 6 from a mixture of $Al_2O_3$, $SiO_2$ and $Cu_2O$ as a target material by sputtering. Then, in the same manner as in Example 2, Cu was deposited from $Cu_2O$ by laser beam irradiation to form a wiring pattern 9.

Then, another insulating layer 8" consisting of $Al_2O_3$, $SiO_2$ and $Cu_2O$ and having a layer thickness of 2 μm was formed thereon by sputtering, and the surface of insulating layer 8" was irradiated at the position corresponding to via-hole with a laser beam in the same manner as in Example 2 to deposit Cu from $Cu_2O$, whereby a connecting part 10 was formed. The steps of forming the insulating layer 8" having the layer thickness of 2 μm and irradiating the position corresponding to the via-hole with the laser beam were repeated until the overall insulating layer 8 had a thickness of 10 μm. Then, the surface of insulating layer 8 was irradiated with a laser beam in the same manner as in Example 2 to form a wiring pattern consisting of 9 and 9'.

In this embodiment, the parts irradiated with the laser beam had a good electroconductivity such as $10^{-4}$–$10^{-5}$ Ω.cm, while the non-irradiated parts had a good electric insulation such as $10^{11}$–$10^{14}$ Ω.cm. The insulating layer 8' consisting of $Al_2O_3$, $SiO_2$ and $Cu_2O$ had a surface irregularity of less than 0.1 μm, that is, a very good surface smoothness. Thus, the insulating layer 8" consisting of the same insulating substances could be suppressed to a thickness fluctuation of less than 3%, and thus had a surface irregularity of less than 0.1 μm.

EXAMPLE 7

In place of the laser beam used as an energizing means for locally metalizing the insulating layer in the foregoing Examples 2 to 6, an electron beam could be used with equivalent good results. Also aqueivalent good results could be obtained with a beam of metal ions of low resistivity such as ions of Cu, Au, Ag, Al, etc. when irradiated with an energy of 1–400 Ke.

In the foregoing Examples, the insulating substance is metalized with an energizing beam, and thus no photomask is required for patterning of wiring. Furthermore, an insulating layer consisting of a plurality of insulating substance is used and other insulating substances than the specific one are prevented from metalizing even by irradiation of the beam, and thus the metalized parts will not unduly extend from the beam-irradiated parts, that is, a fine wiring pattern can be formed with an increasing density in the individual layers. Furthermore, the thickness of wiring pattern in the individual layers and that of the insulating layer between the wiring patterns can be kept even, and thus the number of layers can be considerably increased, as compared with the conventional art.

What is claimed is:

1. A process for producing a wiring circuit board, which comprises providing an insulating layer comprising at least two insulating substances having different dissociation energies for metalization, including metal elements, on a substrate, and irradiating the insulating layer with an energizing beam by scanning, thereby forming a wiring pattern as desired.

2. The process according to claim 1, wherein the insulating layer is formed (a) by oxidizing a metal layer formed by vaporization of at least two kinds of metals, or (b) by providing at least two kinds of insulating substances including metal elements by vapor deposition, sputtering or electron beam irradiation.

3. The process according to claim 2, wherein the oxidation of the metal layer is carried out in an atmosphere of $O_2$, or a gas mixture of $O_2$ and $N_2$, or $O_2$ and Ar.

4. The process according to claim 1, wherein the energizing beam is a laser beam, an electron beam or a metal ion beam.

5. The process according to claim 2, wherein at least two kinds of the metals are Cu and Si, and at least two kinds of the insulating substances including metal elements are $SiO_2$ and $Cu_2O$, or $Al_2O_3$, $SiO_2$ and $Cu_2O$.

6. A process for producing a wiring circuit board, which comprises providing a first insulating layer comprising at least two insulating substances having different dissociation energies for metalization, including metal elements, on a substrate, irradiating the insulating layer with an energizing beam by scanning, thereby forming a first wiring pattern as desired, providing a second insulating layer on the first insulating layer and the first wiring pattern in the same manner as above, irradiating the second insulating layer at a position corresponding to a via-hole by an energizing beam, thereby forming a connecting part connected to the first wiring pattern, irradiating the second insulating layer at a predetermined position with an energizing beam, thereby forming a second wiring pattern connected to the connecting part, and repeating formation of further insulating layers, connecting parts and wiring patterns, as required, thereby forming a multi-layer structure.

7. The process according to claim 6, wherein the insulating layers are formed (a) by oxidizing a metal layer formed by vaporization of at least two kinds of metals, or (b) by providing at least two kinds of insulating substances including metal elements by vapor deposition, sputtering or electron beam irradiation.

8. The process according to claim 7, wherein the oxidation of the metal layer is carried out in an atmosphere of $O_2$ or a gas mixture of $O_2$ and $N_2$, or $O_2$ and Ar.

9. The process according to claim 6, wherein the energizing beam is a laser beam, an electron beam, or a metal ion beam.

10. The process according to claim 7, wherein at least two kinds of the metals are Cu and Si, and at least two kinds of the insulating substances including metal element are $SiO_2$ and $Cu_2O$, or $Al_2O_3$, $SiO_2$ and $Cu_2O$.

* * * * *

UNITED STATES PATENT AND TRADEMARK OFFICE
CERTIFICATE OF CORRECTION

PATENT NO. : 4,457,950

DATED : July 3, 1984

INVENTOR(S) : T. FUJITA et al.

It is certified that error appears in the above-identified patent and that said Letters Patent is hereby corrected as shown below:

Title page, left-hand column, the name "Gyazo Toda" should read --Gyozo Toda--

Signed and Sealed this

Twenty-sixth Day of February 1985

[SEAL]

Attest:

DONALD J. QUIGG

Attesting Officer

Acting Commissioner of Patents and Trademarks